US008338195B2

(12) United States Patent
Sasaki et al.

(10) Patent No.: US 8,338,195 B2
(45) Date of Patent: Dec. 25, 2012

(54) METHOD FOR MANUFACTURING A LIQUID-EJECTION HEAD

(75) Inventors: Koji Sasaki, Nagareyama (JP); Kazuhiro Asai, Kawasaki (JP); Keiji Edamatsu, Fukushima (JP); Yoshinori Tagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

(21) Appl. No.: 13/191,023

(22) Filed: Jul. 26, 2011

(65) Prior Publication Data

US 2012/0028384 A1 Feb. 2, 2012

(30) Foreign Application Priority Data

Jul. 30, 2010 (JP) ................................ 2010-172293

(51) Int. Cl.
*H01L 21/00* (2006.01)

(52) U.S. Cl. ........................................................ 438/21

(58) Field of Classification Search .................... 438/21; 347/1-109

See application file for complete search history.

(56) References Cited

U.S. PATENT DOCUMENTS

| | | | | |
|---|---|---|---|---|
| 6,123,863 | A * | 9/2000 | Shimomura et al. | 216/27 |
| 6,409,931 | B1 * | 6/2002 | Shimomura et al. | 216/27 |
| 6,513,896 | B1 * | 2/2003 | Kawamura | 347/15 |
| 7,198,353 | B2 | 4/2007 | Hart et al. | |
| 7,560,224 | B2 * | 7/2009 | Sato et al. | 430/320 |
| 2006/0117564 | A1 * | 6/2006 | Ishikura et al. | 29/890.1 |
| 2006/0134896 | A1 * | 6/2006 | Ono | 438/584 |

* cited by examiner

*Primary Examiner* — Fernando L Toledo
*Assistant Examiner* — Karen Kusumakar
(74) *Attorney, Agent, or Firm* — Canon USA Inc IP Division

(57) ABSTRACT

A method for manufacturing a liquid-ejection head having a plurality of nozzles arranged to eject liquid includes: preparing a substrate having a first layer, a second layer, and a third layer stacked in this order, the second layer more resistant than the third layer to etching by an etching method to be used on the third layer; partially etching the third layer by the etching method to expose the second layer; and removing the exposed second layer at least in part to expose some area on the top surface of the first layer, opening a first one of the nozzles down from the exposed area of the top surface, and opening a second one of the nozzles down from the top surface of the third layer.

10 Claims, 3 Drawing Sheets

METHOD FOR MANUFACTURING A LIQUID-EJECTION HEAD

BACKGROUND OF THE INVENTION

1. Field of the Invention

The present invention relates to a method for manufacturing a liquid-ejection head (an ejection head arranged to eject liquid therefrom), or more specifically to a method for manufacturing an inkjet recording head (a recording head arranged to eject ink therefrom onto a recording medium to record an image).

2. Description of the Related Art

A known example of liquid-ejection heads is an inkjet recording head, that is, a recording head arranged to eject ink therefrom onto a recording medium to record an image. For example, U.S. Pat. No. 7,198,353 discloses an "ink jet printhead," which has a flow feature (a nozzle plate) nonuniform in thickness so that the distance from an exit opening to its corresponding generator of energy for ejecting ink should be different between exit openings for discharging black ink and those for discharging colored one, enabling one to eject black and colored inks in different amounts. This publication also discloses a method for manufacturing such a nozzle plate, in which a single plate is partially etched to be nonuniform in thickness.

SUMMARY OF THE INVENTION

The present invention provides, in one of its aspects, a method for manufacturing a liquid-ejection head having a plurality of nozzles arranged to eject liquid. This method includes the following: preparing a substrate having a first layer, a second layer, and a third layer stacked in this order, the second layer more resistant than the third layer to etching by an etching method to be used on the third layer; partially etching the third layer by the etching method to expose the second layer; and removing the exposed second layer at least in part to expose some area on the top surface of the first layer, opening a first one of the nozzles down from the exposed area of the top surface, and opening a second one of the nozzles down from the top surface of the third layer.

Further features of the present invention will become apparent from the following description of exemplary embodiments with reference to the attached drawings.

DESCRIPTION OF THE EMBODIMENTS

Figure 1A:
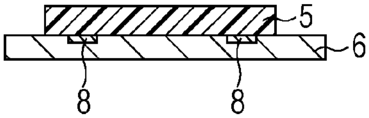
FIGS. 1A to 1H are schematic cross-sectional diagrams for illustrating Embodiment 1 of the present invention.

In the method described in the issued patent mentioned herein, U.S. Pat. No. 7,198,353, varying degrees of etching in the direction of etching advance make the flow feature nonuniform in thickness. This means, however, that this method has a problem in that the process of making the flow feature nonuniform in thickness may lack precision, and, as a result, the amounts of ejected droplets cannot be maintained within their intended range.

To solve this problem, an aspect of the present invention provides a liquid-ejection head manufacturing method that makes possible a high-yield production of a liquid-ejection head having a nozzle member (i.e., the "flow feature" in the issued patent mentioned herein) precisely shaped to have different thicknesses for individual sets of nozzles ("exit openings").

The following describes embodiments of the present invention with reference to the attached drawings. Components having the same function are represented by the same reference numeral throughout the following description and in the drawings, and the explanation about them may appear only once.

In addition, the liquid-ejection head mentioned hereinafter can also be used to produce a color filter or for any other similar purpose, in addition to serving as an inkjet recording head.

Figure 3:
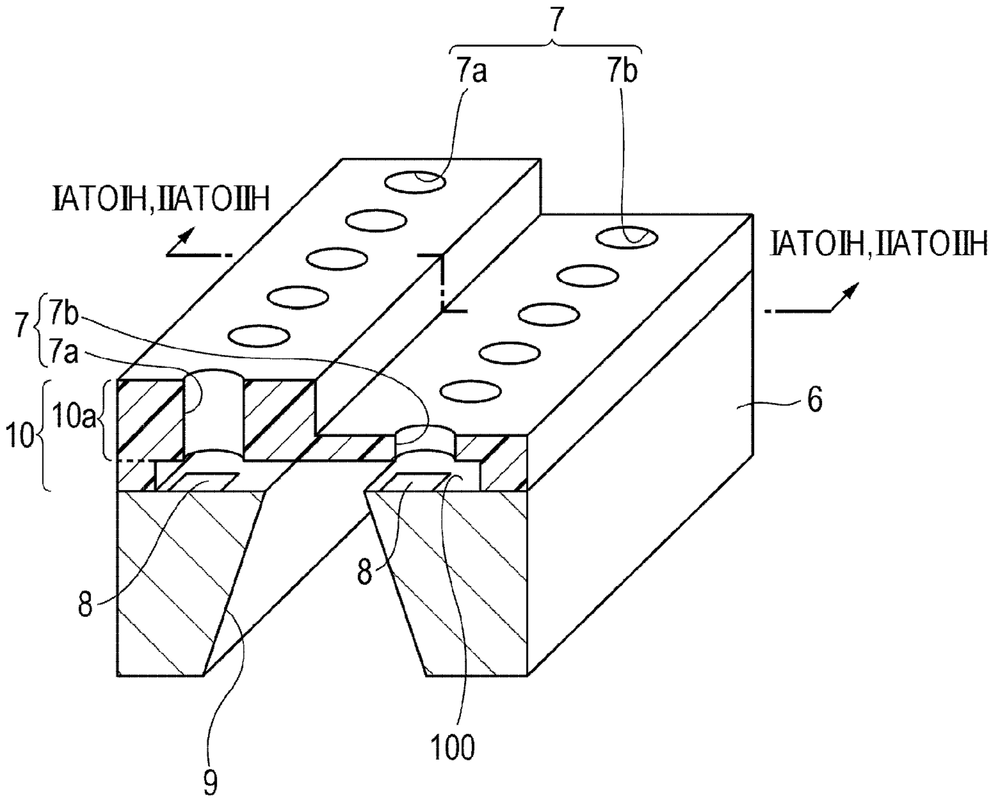
FIG. 3 is a perspective view of a liquid-ejection head according to the present invention.

FIG. 3 illustrates a liquid-ejection head made by the liquid-ejection head manufacturing method according to an embodiment of the present invention, providing a schematic perspective view along with a cross-section of the head. The liquid-ejection head has a substrate 6, nozzles 7, energy generators 8, and a nozzle member 10. The substrate 6 has the energy generators 8 formed thereon, and the energy generators 8 generate energy for use in ejecting liquid. The nozzle member 10, together with the substrate 6, forms a passage 100 for liquid, and this passage 100 communicates with the nozzles 7. On this single substrate 6, first nozzles 7*a* and second nozzles 7*b* are arranged to communicate with the same passage 100, but the top of the first nozzles 7*a* is farther from the surface having the energy generators 8 formed thereon than the top of the second nozzles 7*b*. The height of the passage 100 from the substrate 6 is substantially uniform; however, the thickness of the nozzle member 10 from the top of the passage 100 to the top of the nozzles 7 (i.e., the thickness of the portion 10*a*) is larger in the portion for the first nozzles 7*a* and smaller in the portion for the second nozzles 7*b*. Thus, the first nozzles 7*a* are thicker, or longer, than the second nozzles 7*b*. Furthermore, the passage 100 communicates with a supply port 9, which may be a channel or opening through the substrate 6. This at least enables the liquid-ejection head to eject a single kind of liquid (e.g., a single color of ink) in different amounts. The energy generators 8 arranged on the substrate 6 are a desired number of electrothermal transducers, piezoelectric elements, or the like. The desired number may be a minimum number required to eject a single kind of liquid and may vary depending on operational requirements and type of energy generators 8. These energy generators 8 supply the ink with energy to eject itself in the form of droplets; as a result, a record is produced. For example, when the energy generators 8 are electrothermal transducers, the transducers heat nearby volumes of liquid and make changes to the status of the liquid, thereby generating ejection energy (energy for use in ejecting the ink or liquid filled in the head). And, when the energy generators 8 are piezoelectric elements, mechanical vibrations of these elements generate ejection energy. In addition, these energy generators 8 are connected to control signal input electrodes, electrodes for giving them signals necessary for their operation (not shown in the drawing).

Embodiment 1

FIGS. 1A to 1H are schematic cross-sectional diagrams illustrating a cross-section taken along line IA to IH-IA to IH in FIG. 3 perpendicular to the substrate 6 at each manufacturing step.

First, as illustrated in FIG. 1A, a passage pattern 5 for liquid is formed as a soluble resin layer on a substrate 6 having energy generators 8. The soluble resin layer for use as the passage pattern 5 can be formed by kinds of film formation techniques including spin coating and roller coating. Since this passage pattern 5 may be used as a mold of a passage, its thickness is preferably in a range of 5 μm to 15 μm. The material of a soluble resin layer can be photosensitive for photolithographic patterning precise with regard to the positional relationship with the energy generators 8. Examples of the materials that can be used here thus include a solution of polymethyl isopropenyl ketone (PMIPK) in cyclohexanone, a solution of polymethyl methacrylate (PMMA) in diethylene glycol diethyl ether, and so forth.

Figure 1B:
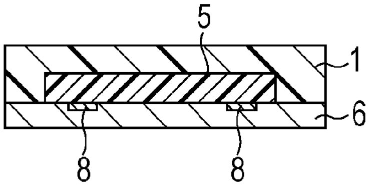

Then, as illustrated in FIG. 1B, a first layer 1 for use as the nozzle member may be formed over the passage pattern 5 by spin coating, roller coating, or any other appropriate technique. In this step of forming the first layer 1, some requirements may be imposed on the characteristics of the components involved; for example, the components involved should not deform the passage pattern 5. In other words, the solvent dissolving the material of the first layer 1 and being applied to the passage pattern 5 by spin coating, roller coating, or the like should not be able to dissolve the passage pattern 5. To function as a nozzle member 10, the first layer 1 should have at least a high mechanical strength for use as a structural component of a passage for liquid, adhesiveness to the substrate 6, and resistance to liquid. Examples of such materials include a solution containing Composition 1 specified below in a mixture of methyl isobutyl ketone and xylene at a concentration of 60 wt % (weight percent).

Resin Composition 1

Name Parts by Weight

EHPE-3150 (Daicel Chemical Industries, Ltd.) 100

A-187 (Nippon Unicar Company Limited) 5

SP-172 (ADEKA Corporation) 6

This composition may further contain additives, if necessary. The obtained solution is applied to the passage pattern 5 to produce a coating having a thickness in a range of 15 μm to 30 μm, providing, or constituting the first layer 1.

Figure 1C:
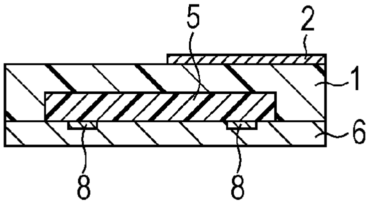

Then, as illustrated in FIG. 1C, a second layer 2 is formed on the first layer 1 to cover the first layer 1, at least in part. The following requirements may be imposed on the second layer 2: it can be patterned; and it has a higher etching selectivity than the first layer 1 and a third layer (described later), or in other words, its resistance to etching by an etching method to be used on the third layer is sufficiently higher or greater than that of the third layer. The material of the second layer 2 can be photosensitive so that the second layer 2 can be patterned with a high precision. Examples of the materials that can be used as the second layer 2 may include positive resists such as silicon-containing resists, as well as silicon oxides and silicon nitrides; these photosensitive resists can be formed by photolithography and thus can be patterned with a high precision. When the nozzle member 10 has a thickness of 15 μm to 30 μm, inclusive, the thickness of the second layer 2 may be preferably in a range of 2 μm to 5 μm, inclusive, so that the second layer 2 can be resistant to etching. The second layer 2 can also be formed in other ways; for example, a material mainly composed of Ti or any other similar metal is sputtered to form the second layer 2 with a thickness of approximately 0.5 μm. In this case, it is possible to form a predefined resist pattern by photolithography with this second layer 2 as a shielding layer and then etch the second layer 2 by an Ar-ion-based dry etching technique such as ion milling. In addition, the second layer 2 may be formed to cover the entire surface of the first layer 1.

Figure 1D:
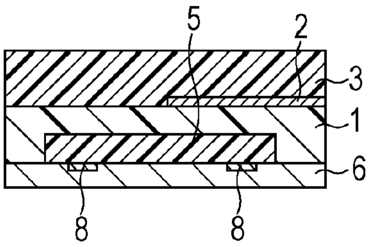

As illustrated in FIG. 1D, the formation of the third layer 3 may be resumed on the first layer 1 and the second layer 2. As with the first layer 1, the third layer 3 should have a high mechanical strength for use as a structural component of a passage for liquid as well as for resistance to liquid. The thickness of the third layer 3 is preferably in a range of 15 μm to 30 μm. The material of the third layer 3 can have the same composition as that of the first layer 1 so that a compatibility with the first layer 1 can be ensured. For example, the first layer 1 and the third layer 3 can be made of a single type of cured or uncured epoxy resin or silicon compound.

Figure 1E:
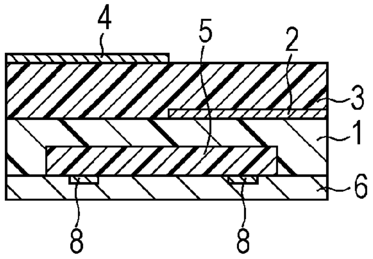

As illustrated in FIG. 1E, a fourth layer 4 may be formed on the third layer 3. The fourth layer 4 should have a higher etching selectivity than the third layer 3 and the material of the fourth layer 4 should not be too compatible with the material of the third layer 3. The material can be photosensitive for precise patterning. For example, positive resists such as Si-containing resists can be used; these photosensitive resists can be formed by photolithography and thus can be patterned with a high precision. When the nozzle member 10 has a thickness of 15 μm to 30 μm, inclusive, the thickness of the fourth layer 4 is preferably in a range of 2 μm to 5 μm, inclusive. The fourth layer 4 can also be formed in other ways; for example, a material mainly composed of Ti is sputtered or sprayed to form the fourth layer 4 as a shielding layer having a thickness of approximately 0.5 μm. As a result of these steps, a substrate having four layers from a first layer 1 to a fourth layer 4 stacked thereon is prepared.

Figure 1F:
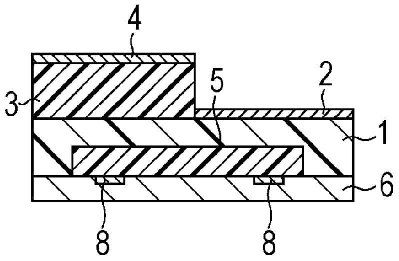

Then, as illustrated in FIG. 1F, the third layer 3 may be partially etched in the direction from its top toward the substrate 6 with the fourth layer 4 at least functioning as a mask. An example of the etching techniques that can be used in this process may be dry etching with oxygen. The portion of the third layer 3 not covered with the fourth layer 4 may be etched, and the second layer 2 may become exposed after a certain period of etching. Since the etching selectivity can greatly differ between the second layer 2 and the third layer 3, etching apparently terminates at the second layer 2 even if machining in the depth direction somewhat lacks precision. Thus, the first layer 1 may be protected during this etching process. As a result, the top surface of the first layer 1, on which the second nozzles 7*b* are to be formed, can be advantageously maintained at a desired height despite varying etching rates.

Figure 1G:
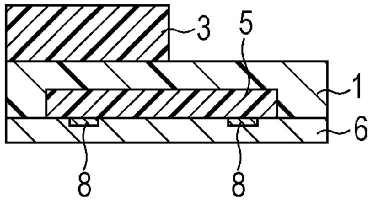
Figure 1H:
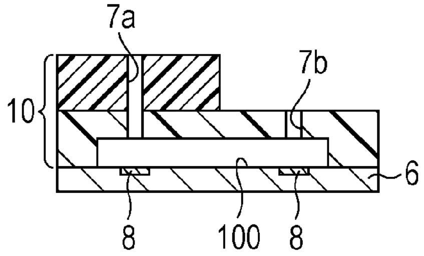

Then, as illustrated in FIG. 1G, the second layer 2 and the fourth layer 4 may be removed to expose the portion for the opening of the second nozzles 7*b* on the first layer 1 and that portion for the opening of the first nozzles 7*a* on the third layer 3. When the material of the second layer 2 and that of the fourth layer 4 have the same composition, these two layers can be dissolved and removed together. In some embodiments, a portion of the second layer 2 and the fourth layer 4 may be left without being removed.

Then, nozzles may be opened through the first layer 1 and the third layer 3 by photolithography, or any other appropriate technique. As a result, the first nozzles 7*a* are opened down from the top surface of the third layer 3, and the second nozzles 7*b* from the area of the top surface of the first layer 1 exposed after the removal of the second layer 2. Then, the pattern 5 may be removed to open a passage 100.

Table 1 provides some exemplary combinations of the material of the second layer 2 and the material of the third layer 3 for sufficient etching selectivity between the two layers as well as some methods for the etching of the third layer 3.

TABLE 1

| | Second layer | Third layer | Dry etching gas for third layer |
|---|---|---|---|
| Combination 1 | Ti, W, Nb, Au, Pt, silicon oxide, silicon nitride, aluminum oxide | Cured epoxy resin | Oxygen |
| Combination 2 | Au, Pt, aluminum oxide | Silicon oxide, silicon, silicon nitride | $CF_4$, $SF_6$ |
| Combination 3 | Au, Pt, aluminum oxide | Cured epoxy resin | Oxygen |
| Combination 4 | Au, Pt, aluminum oxide | Silicon oxide, silicon | $CF_4$, $SF_6$ |

Embodiment 2

The following describes Embodiment 2 with reference to FIGS. 2A to 2H. FIGS. 2A to 2H illustrate a cross-section in the same way as FIGS. 1A to 1H.

In this embodiment, the second layer 2 and the fourth layer 4 can have openings corresponding in shape and position to the nozzles, and these openings are used to open the nozzles.

Figure 2A:
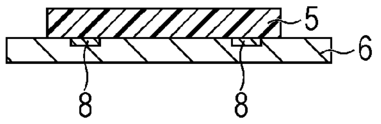
FIGS. 2A to 2H are schematic cross-sectional diagrams for illustrating Embodiment 2 of the present invention.

First, as illustrated in FIG. 2A, a passage pattern 5 is formed on a substrate 6 in the same way as in Embodiment 1.

Figure 2B:
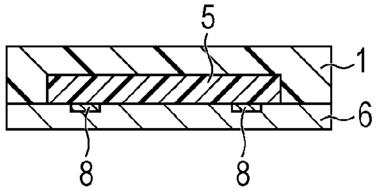

Then, as illustrated in FIG. 2B, a first layer 1 may be formed in the same way as in Embodiment 1; it may be formed over the passage pattern 5 by spin coating, roller coating, or any other appropriate method.

Figure 2C:
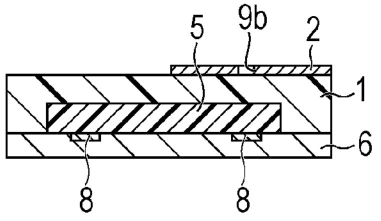

Then, as illustrated in FIG. 2C, a second layer 2 is formed over the first layer 1 in a similar manner as in Embodiment 1. Note that in this embodiment, the second layer 2 has second openings 9*b* corresponding in approximate shape and approximate position to the second nozzles 7*b*.

Figure 2D:
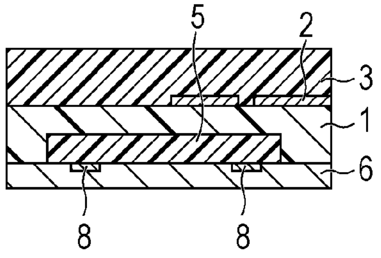

Then, as illustrated in FIG. 2D, a third layer 3 is formed over the second layer 2 in a similar manner as in Embodiment 1.

Figure 2E:
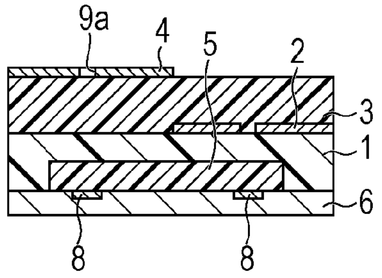

Then, as illustrated in FIG. 2E, a fourth layer 4 is formed on the third layer 3 to at least partially cover the top surface. Note that in this embodiment, unlike in Embodiment 1, the fourth layer 4 has first openings 9*a* corresponding in approximate shape and approximate position to the first nozzles 7*a*.

Then, the third layer 3 may be etched with the fourth layer 4 at least functioning as a mask. Dry etching can be used here.

Figure 2F:
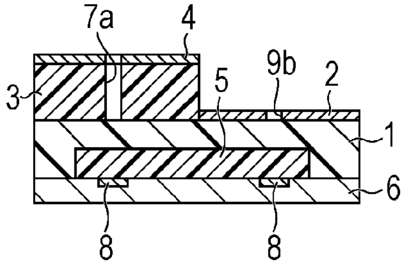

As a result, as illustrated in FIG. 2F, the second openings 9*b* and surrounding areas on the second layer 2 are exposed, and the first nozzles 7*a* are opened under the first openings 9*a* through the third layer 3.

Figure 2G:
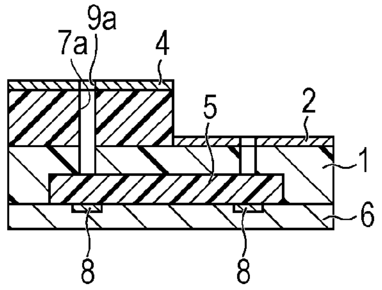

The etching process is continued, with the second layer 2 at least functioning as a mask, until the portions of the first layer 1 corresponding to the second openings 9*b* are etched and removed. In parallel with this, the portions of the first layer 1 corresponding to the first openings 9*a* may be etched and removed with the fourth layer 4 at least functioning as a mask. As a result, through-holes are opened, beginning with the first openings 9*a* and penetrating the third layer 3, the boundary between the third layer 3 and the first layer 1, and the first layer 1. The first nozzles 7*a* may be in communication with the passage pattern 5. In parallel with this, the second nozzles 7*b* also may be in communication with the passage pattern 5, as illustrated in FIG. 2G. The second layer 2 may function as a mask, the second nozzles 7*b* can be opened and/or positioned with a high precision.

Figure 2H:
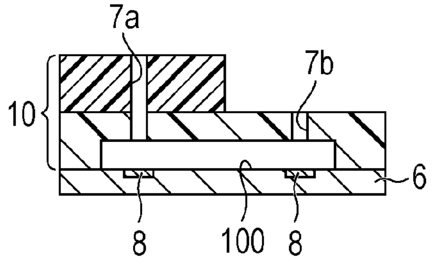

Then, the passage pattern 5 may be removed to open a passage 100, and the second layer 2 and the fourth layer 4 may be removed, as illustrated in FIG. 2H. The second layer 2 and the fourth layer 4 may be left without being removed. When the second layer 2 and the fourth layer 4 are made of the same material and so are the first layer 1 and the third layer 3, the conditions of etching can be easily chosen.

In both Embodiments 1 and 2, explanations about the opening of the supply port 9 are omitted.

In some embodiments of the present invention described herein, the layers for use as the nozzle member include an intermediate layer highly resistant to etching, and this etching-resistant layer makes the etching process for machining the nozzle member stop with a high positional precision, enabling a high-yield production of a liquid-ejection head having a nozzle member precisely shaped to have different thicknesses for individual sets of nozzles.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-172293 filed Jul. 30, 2010, which is hereby incorporated by reference herein in its entirety.

What is claimed is:

1. A method for manufacturing a liquid-ejection head having a substrate and a nozzle member, the substrate having a first energy generator and a second energy generator to generate energy for use in ejecting liquid, the nozzle member having a first nozzle and a second nozzle arranged to eject liquid, the first nozzle and the second nozzle opened to correspond in shape and position to the first energy generator and the second energy generator, respectively, and a distance from the first energy generator to the first nozzle is longer than a distance from the second energy generator to the second nozzle, comprising:

making the substrate having a first layer, a second layer, and a third layer stacked in this order on the substrate, the second layer more resistant than the third layer to etching by an etching method to be used on the third layer;

partially etching the third layer by the etching method to expose the second layer;

removing the exposed second layer at least in part to expose a portion of the first layer; and forming the nozzle member by opening the second nozzle through an exposed portion of the first layer, opening the first nozzle through an un-etched portion of the third layer, and removing the portion of the first layer corresponding to the first nozzle.

2. The method for manufacturing a liquid-ejection head according to claim 1, wherein:

the first layer and the third layer are made of resin, the second layer is made of metal or a silicon compound, and the etching method is dry etching.

3. The method for manufacturing a liquid-ejection head according to claim 1, wherein:

the first layer and the third layer are made of a silicon compound, the second layer is made of metal, and the etching method is dry etching.

4. The method for manufacturing a liquid-ejection head according to claim 2, wherein:

the silicon compound is a silicon oxide or a silicon nitride.

5. The method for manufacturing a liquid-ejection head according to claim 1, wherein:

the first layer and the third layer are at least partly in contact with each other.

6. A method for manufacturing a liquid-ejection head having a substrate and a nozzle member, the substrate having a first energy generator and a second energy generator to generate energy for use in ejecting liquid, the nozzle member having a first nozzle and a second nozzle arranged to eject liquid, the first nozzle and the second nozzle opened to correspond in shape and position to the first energy generator and the second energy generator, respectively, and a distance from the first energy generator to the first nozzle is longer than a distance from the second energy generator to the second nozzle, comprising:

making the substrate having a first layer, a second layer, a third layer, and a fourth layer stacked in this order on the substrate, the first layer to function as a portion of the nozzle member, the second layer having a first opening, the third layer to function as another portion of the nozzle member, and the fourth layer having a second opening and partly covering the third layer;

opening the first nozzle, which corresponds to the first opening, through the third layer and exposing the second layer by etching the third layer with the fourth layer at least functioning as a mask; and opening the second nozzle, which corresponds to the second opening, through the first layer and removing the portion of the first layer corresponding to the first nozzle by etching the first layer with the second layer at least functioning as a mask, thereby producing the nozzle member.

7. The method for manufacturing a liquid-ejection head according to claim 6, wherein:

the first layer and the third layer are made of resin, the second layer is made of metal or a silicon compound, and the first layer and the third layer are etched by dry etching.

8. The method for manufacturing a liquid-ejection head according to claim 6, wherein:

the first layer and the third layer are made of a silicon compound, the second layer is made of metal, and the first layer and the third layer are etched by dry etching.

9. The method for manufacturing a liquid-ejection head according to claim 7, wherein:

the silicon compound is a silicon oxide or a silicon nitride.

10. The method for manufacturing a liquid-ejection head according to claim 6, wherein:

the third layer has a contact area that is in contact with the first layer, and a through-hole is opened beginning with the first opening and penetrating the third layer, the contact area of the third layer, and the first layer while the first layer and the third layer are etched with the fourth layer at least functioning as a mask.

* * * * *